United States Patent
Gupta et al.

(10) Patent No.: US 10,438,677 B1
(45) Date of Patent: Oct. 8, 2019

(54) MODULAR SAMPLE-AND-HOLD CIRCUIT

(71) Applicant: NXP B.V., Eindhoven (NL)

(72) Inventors: Sushil Kumar Gupta, Bangalore (IN); Hitesh Kumar Garg, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/197,290

(22) Filed: Nov. 20, 2018

(51) Int. Cl.
*G11C 27/02* (2006.01)
*H03M 1/12* (2006.01)
*H03M 1/46* (2006.01)

(52) U.S. Cl.
CPC ......... *G11C 27/026* (2013.01); *H03M 1/1245* (2013.01); *H03M 1/468* (2013.01)

(58) Field of Classification Search
CPC ....... G11C 27/00; G11C 27/02; G11C 27/024; G11C 27/026; H03K 5/00; H03K 5/249; H03M 1/00; H03M 1/1245; H03M 1/468
USPC .......................................................... 327/94
See application file for complete search history.

(56) References Cited

U.S. PATENT DOCUMENTS

| | | |
|---|---|---|
| 5,149,954 A | 9/1992 | Pettijohn et al. |
| 6,583,747 B1 | 6/2003 | van der Goes et al. |
| 7,315,593 B2 | 1/2008 | Hagen et al. |
| 7,724,042 B2 | 5/2010 | Mathur |
| 8,890,729 B2 | 11/2014 | Lewis et al. |
| 9,906,233 B2 | 2/2018 | Danson et al. |
| 2009/0009219 A1* | 1/2009 | Mathur ................ G11C 27/026 327/94 |
| 2017/0162275 A1* | 6/2017 | Gao ...................... G11C 27/026 |

* cited by examiner

*Primary Examiner* — Lincoln D Donovan
*Assistant Examiner* — Dave Mattison
(74) *Attorney, Agent, or Firm* — Rajeev Madnawat

(57) ABSTRACT

A sample-and-hold circuit is broken down into multiple parallel modules, and an output switch, where each module includes a switch and a capacitor. Each of the switches in the modules and the output switch are controlled by different phases of a clock signal. The sample-and-hold circuit receives an input signal and operates in sample and hold modes to generate a sampled output signal.

15 Claims, 4 Drawing Sheets

MODULAR SAMPLE-AND-HOLD CIRCUIT

BACKGROUND

The present invention relates generally to electronic circuits, and, more particularly, to a sample-and-hold circuit.

Sample-and-hold circuits are made with a sampling capacitor and switches, which are driven by a single clock phase. The sample-and-hold circuit draws spiky current (i.e., peak voltage) when sampling starts, which leads to high power consumption. The spiky current problem is exacerbated when the sampling capacitor value is high, which is the case for high-resolution linear systems, which imposes a big restriction or a huge power requirement on the circuit driving the sample-and-hold circuit (e.g., amplifier, buffer or filter) because it increases settling error. A simple example is a sample-and-hold circuit inside an ADC (Analog-to-Digital Converter), which is driven by an amplifier such as a Programmable Gain Amplifier (PGA). Different complicated techniques must be used between the sample-and-hold circuit and the PGA to overcome the spiky current problem.

FIG. 1 shows a conventional sample-and-hold circuit 100, which includes a first switch 102, a capacitor 104, and a second switch 106. The first switch 102 receives an input signal from a driving circuit (e.g., a PGA) and is controlled by a clock signal at a first phase Clk. When the first switch 102 is closed, the capacitor 104 receives and is charged by the input signal. The capacitor 104 is discharged when the second switch is closed. The second switch 106 is controlled by the clock signal at a second phase $Clk_e$, which typically is a delayed version of the clock signal at the first phase Clk. Thus, the clock signal at the second phase $Clk_e$ determines a sampling moment of the capacitor 104.

The sample-and-hold circuit 100 operates in sample and hold modes to provide a sampled output signal. That is, when the second switch 106 is closed, the sample-and-hold circuit 100 operates in the sample mode and samples the input signal, and when the second switch 106 is opened, the sample-and-hold circuit 100 operates in the hold mode and holds a voltage level of the sampled input signal in the capacitor 104.

A known solution to limit spiky current is to connect a low-pass filter (LPF) between the driving circuit and the sample-and-hold circuit 100. However, the LPF introduces additional input resistance at the input to the sample-and-hold circuit 100, which degrades ADC linearity. Another solution to limit the spiky current is to introduce a cascode switch between the driving circuit and the sample-and-hold circuit 100. However, the cascode switch, although reducing the peak current, still leads to high power consumption and an increase in circuit area.

Therefore, it would be advantageous to have a sample-and-hold circuit that draws less spiky current and consumes less power and area.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 3:
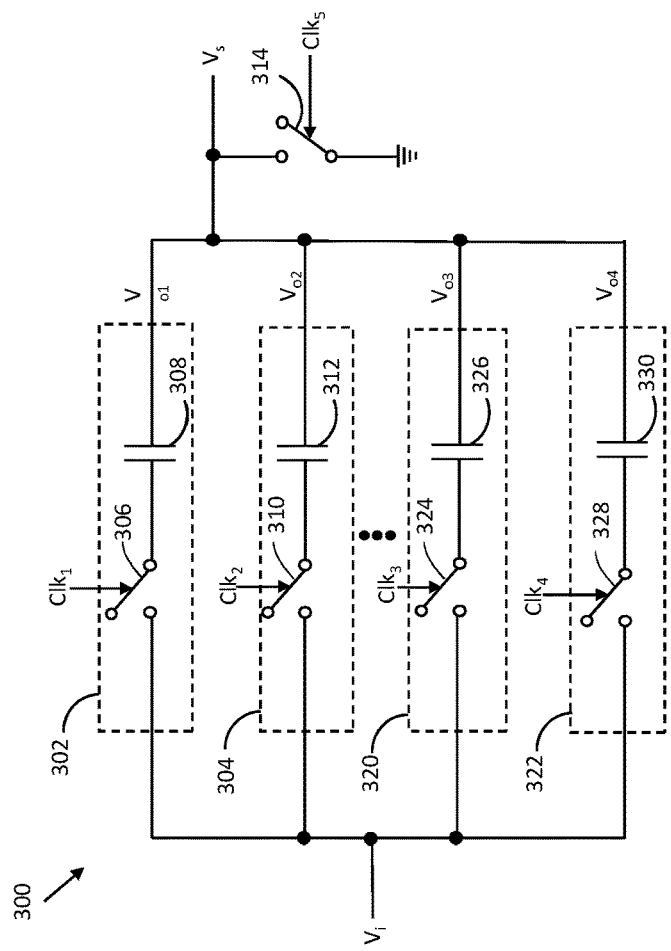
FIG. 3 is a schematic circuit diagram of a sample-and-hold circuit in accordance with an embodiment of the present invention.
Figure 1:
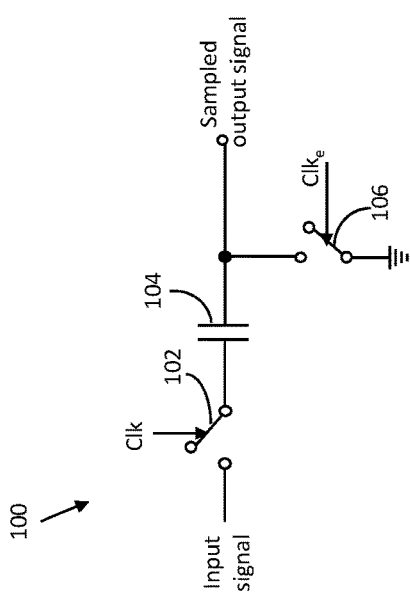
FIG. 1 is a schematic circuit diagram of a conventional sample-and-hold circuit.

The detailed description of the appended drawings is intended as a description of the currently preferred embodiments of the present invention and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a sample-and-hold circuit that receives an input signal and generates a sampled output signal. The sample-and-hold circuit includes first and second sample-and-hold modules and an output switch. The first sample-and-hold module receives the input signal and a first phase of a clock signal, and the second sample-and-hold module, which is connected in parallel to the first sample-and-hold module, receives the input signal and a second phase of the clock signal that is different from the first phase. The output switch is connected to outputs of the first and second sample-and-hold modules and is activated and de-activated by a third phase of the clock signal that is different from the first and second phases. The first and second sample-and-hold modules operate in a sample mode when the first switch is activated and in a hold mode when the first switch is de-activated.

In another embodiment, the present invention provides a sample-and-hold circuit that operates in sample and hold modes and generates a sampled output signal. The sample-and-hold circuit includes first and second sample-and-hold modules and an output switch. The first sample-and-hold module comprises a first switch that receives an input signal and is controlled by a first phase of a clock signal, and a first capacitor connected to the first switch for receiving the input signal when the first switch is activated and providing a first output signal in the sample and hold modes. The second sample-and-hold module is connected in parallel with the first sample-and-hold module and comprises a second switch that receives the input signal and is controlled by a second phase of the clock signal that is different from the first phase, and a second capacitor connected to the second switch for receiving the input signal when the second switch is activated and providing a second output signal in the sample and hold modes. The output switch is connected to the first and second capacitors and receives the first and second output signals. The output switch is controlled by a third phase of the clock signal that is different from the first and second phases. The sample-and-hold circuit operates in the sample mode when the third switch is activated and in the hold mode when the third switch is de-activated. The sampled output signal is based on the first and second output signals.

In yet another embodiment, the present invention provides a sample-and-hold circuit that receives an analog input signal and generates a digital output signal. The sample-and-hold circuit includes a plurality of switches each having a first terminal for receiving the analog input signal, and a plurality of capacitors corresponding to the plurality of switches, wherein each capacitor has a first terminal connected to a second terminal of a corresponding one of the switches and a second terminal connected to a node connecting all of the second terminals of the capacitors. The switches are controlled by different phases of a clock signal. The digital output signal is provided at the node connecting the second terminals of the capacitors. An output switch has a first terminal connected to the node and a second terminal connected to ground and is controlled by another, different phase of the clock signal.

The sample-and-hold circuit consumes less area than conventional sample-and-hold circuits due to the switches and capacitors having reduced sizes. Further, by reducing the size of the capacitors and using a clock signal at staggered phases, the sample-and-hold circuit has a less spiky current at a start of sampling, which leads to low power consumption, thereby increasing the linearity of an analog to digital converter using the sample and hold circuit.

Figure 2:
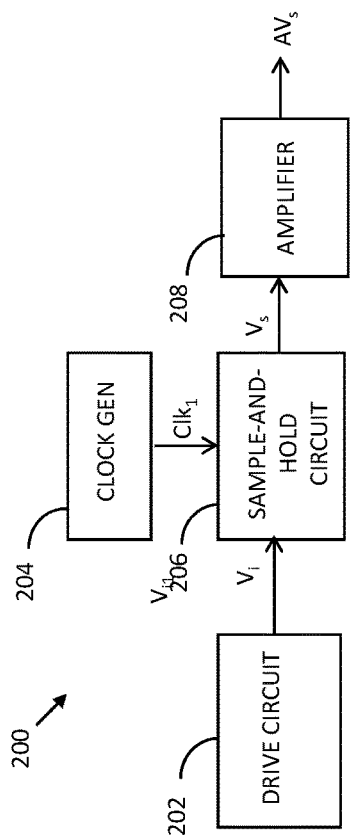
FIG. 2 is a schematic block diagram of an integrated circuit (IC) in accordance with an embodiment of the present invention.

Referring now to FIG. 2, a schematic block diagram of an integrated circuit (IC) 200 in accordance with an embodiment of the present invention is shown. The IC 200 includes a driving circuit 202, a clock generating circuit 204, a sample-and-hold circuit 206, and an amplifier 208. In one embodiment, the IC 200 is part of an analog-to-digital converter (ADC).

The driving circuit 202 provides an analog signal, i.e., an analog input signal $V_i$. In one embodiment, the driving circuit 202 is one of a programmable gain amplifier (PGA), a filter, and a buffer. The clock generating circuit 204 generates a clock signal at a first phase $Clk_1$. In one embodiment, the clock generating circuit 204 is an oscillator.

The sample-and-hold circuit 206 is connected to the driving circuit 202 and the clock generating circuit 204 for receiving the analog input signal $V_i$ and the first phase of the clock signal $Clk_1$, respectively. The sample-and-hold circuit 206 operates in sample and hold modes and generates a digital output signal $V_s$. The amplifier 208 is connected to the sample-and-hold circuit 206 and receives the digital output signal $V_s$. The amplifier 208 amplifies the output signal $V_s$ to generate an amplified version of the sampled output signal $AV_s$.

Referring now to FIG. 3, a schematic circuit diagram of a sample-and-hold circuit 300 in accordance with an embodiment of the present invention is shown. The sample-and-hold circuit 300 includes multiple parallel connected sample-and-hold modules. In this embodiment, four such sample-and-hold modules 302, 304, 320 and 324 are shown. However, the circuit 300 may include fewer or more of the sample-and-hold modules. The first sample-and-hold module 302 includes a first switch 306 and a first capacitor 308. The first switch has a first terminal that receives the analog input signal $V_i$ and is controlled by the first phase of the clock signal $Clk_1$. A second terminal of the first switch 306 is connected to a first terminal of the first capacitor 308, and a first output signal $V_{o1}$ is provided at the second terminal of the first capacitor 308.

The second sample-and-hold module 304 includes a second switch 310 and a second capacitor 312 connected in the same way as the first module 304 except that the second switch is controlled by a second phase $Clk_2$ of the clock signal, and a second output signal $V_{o2}$ is provided at the second terminal of the second capacitor 312. The third sample-and-hold module 320 includes a third switch 324 and a third capacitor 326 connected in the same way as the first and second modules 302 and 304 except that the third switch is controlled by a third phase $Clk_3$ of the clock signal, and a third output signal $V_{o3}$ is provided at the second terminal of the third capacitor 326. The fourth sample-and-hold module 322 receive includes a fourth switch 328 and a fourth capacitor 330 connected in the same way as the first module 304 except that the fourth switch is controlled by a fourth phase $Clk_4$ of the clock signal, and a fourth output signal $V_{o4}$ is provided at the second terminal of the fourth capacitor 330.

As the modules 302, 304, 320 and 324 are connected in parallel, they each receive the analog input signal $V_i$ from a common input node, and their output signals $V_{o1}$-$V_{o4}$ are tied together at a common output node at which the digital output signal $V_s$ is provided. An output switch 314 is connected between the common output node and ground and is controlled by a fifth phase of the clock signal $Clk_5$. When the output switch 314 is activated (closed), the sample-and-hold circuit 300 is in a sampling mode, and when the output switch is deactivated (opened), the sample-and-hold circuit 300 is in a hold mode.

The clock signal is staggered to provide the first-fifth phases of the clock signal $clk_1$-$clk_5$. The staggered clock signals may be generated by delay elements (not shown), as will be understood by those of skill in the art. In one embodiment, a capacitance of each of the first through fourth capacitors 308, 312, 326, and 330 is equal, and in another embodiment, the capacitance of each of the first through fourth capacitors 308, 312, 326, and 330 is different.

Multiple sample-and-hold modules 302, 304, 320 and 322 results in a total capacitance value of the first through fourth capacitors 308, 312, 326, and 330 being divided into smaller capacitances. With reduced capacitance, the sizes of the first-fourth switches 306, 310, 324, and 328 may be reduced. Thus, using reduced size capacitors and switches means the size of the sample-and-hold circuit 206 is readily manageable.

As the first-fifth clock phases are staggered (i.e., delayed with respect to each other), the switches 306, 310, 324, 330 and 314 are activated at different times. Thus, the start of sampling of each of the sample-and-hold modules 302, 304, 320 and 324 is divided into smaller steps. A reduced capacitance of each of the first through fourth capacitors 308, 312, 326 and 330 draws small amounts of peak current when each of the first-fourth switches 306, 310, 324 and 328 are activated, respectively. Due to reduced peak current drawn at the time of activating and deactivating each of the switches 306, 310, 324 and 328, the sample-and-hold circuit 300 consumes less power than conventional sample-and-hold circuits. Further, since the sample-and-hold circuit 300 has a lower power at start-up, less power is dissipated by the driving circuit 202, which increases linearity of the ADC.

Figure 4:
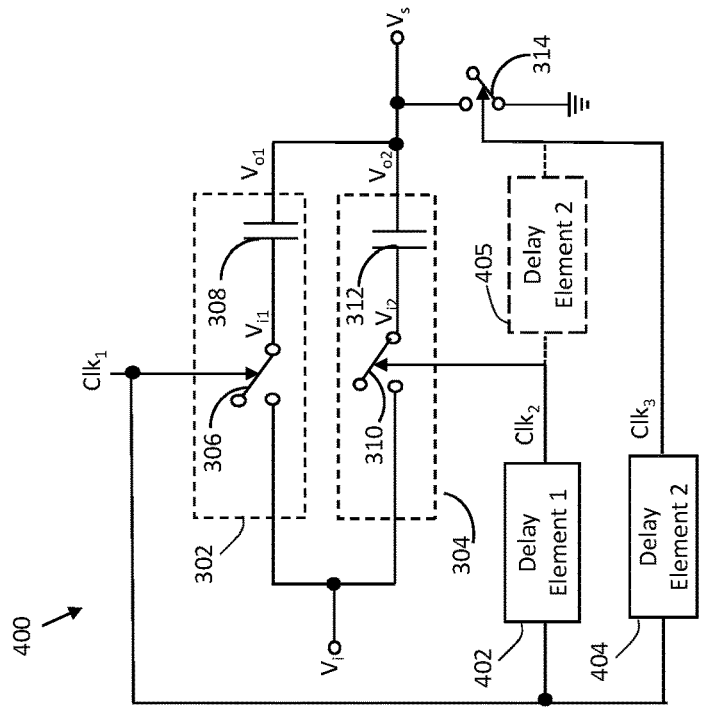
FIG. 4 is a schematic circuit diagram of a sample-and-hold circuit in accordance with another embodiment of the present invention.

FIG. 4 is a schematic circuit diagram of a sample-and-hold circuit 400 in accordance with another embodiment of the present invention. The sample-and-hold circuit 400 includes the first and second sample-and-hold modules 302 and 304 and the output switch 314, as well as first and second delay elements 402 and 404. In one embodiment, sizes of the first and second capacitors 308 and 312 are the same, and in another embodiment, the sizes of the first and second capacitors 308 and 312 are different.

The first sample-and-hold module 302 receives the analog input signal $V_i$ and generates a first output signal $V_{o1}$. The first sample-and-hold module 302 also receives the first phase of the clock signal $Clk_1$ and the input signal. When the first switch 306 is activated (closed), the first capacitor 308 receives the input signal $V_i$, and when the first switch 306 is deactivated (opened), the first capacitor 308 does not receive the input signal $V_i$. The second sample-and-hold module 304 operates in substantially the same way as the first sample-and-hold module 302. That is, when the second switch 310 is activated, the second capacitor 312 receives the input signal $V_i$, and when the second switch 310 is deactivated, the second capacitor 312 does not receive the input signal $V_i$. The second sample-and-hold module 304 outputs the second output signal $V_{o2}$. The first and second output signals $V_{o1}$ and $V_{o2}$ are voltage signals across the first and second capacitors 308 and 312, respectively.

The first delay element 402 is connected to the clock generating circuit 204 (FIG. 2) for receiving the first phase of the clock signal $Clk_1$ and delays the first phase of the clock signal $Clk_1$ by a first delay value to generate the second phase of the clock signal $Clk_2$, where the second phase is different from the first phase. The first delay element 316 may include a first set of series connected buffers or inverters (not shown) for delaying the clock signal $Clk_1$. The output of the first delay element 402, i.e., the second phase of the clock signal $Clk_2$ is provided to the second module 304 for activating and deactivating the second switch 310.

The second delay element 404 also is connected to the clock generating circuit 204 for receiving the clock signal $Clk_1$. The second delay element 318 delays the clock signal $Clk_1$ by a second delay value, and outputs the third phase of the clock signal $Clk_3$, where the third phase is different from the first and second phases. In one embodiment, the second delay value is greater than the first delay value. The second delay element 318 may include a second set of series connected inverters or buffers for delaying the clock signal $Clk_1$. The output of the second delay element 404, i.e., the third phase of the clock signal $Clk_3$ is provided to the output switch 314 for activating and deactivating the output switch 314.

In an alternative embodiment, the second delay element 404 may be connected to the first delay element 402 (as shown in dashed lines as element 405) and receive the second phase of the clock signal $Clk_2$ and delay it to generate the third phase of the clock signal $Clk_3$.

The output switch 314 has a first terminal connected to a node connecting the second terminals of the first and second capacitors 308 and 312, a control terminal connected to the second delay element 318 for receiving the third phase of the clock signal $Clk_3$, and a second terminal connected to ground. In one embodiment, the output switch 314 is an active-low switch and the first and second switches 306 and 310 are active-high switches. When the output switch 314 is activated, the first and second sample-and-hold modules 302 and 304 operate in the sample mode and when the output switch 314 is deactivated, the first and second sample-and-hold modules 302 and 304 operate in the hold mode. The digital output signal $V_s$ is based on the first and second output signals $V_{o1}$ and $V_{o2}$. In one embodiment, the switches 306, 310, and 314 are transistors. The operation of the sample-and-hold circuit 400 of FIG. 4 will be explained in conjunction with the timing diagram of FIG. 5A, below.

Figure 5:
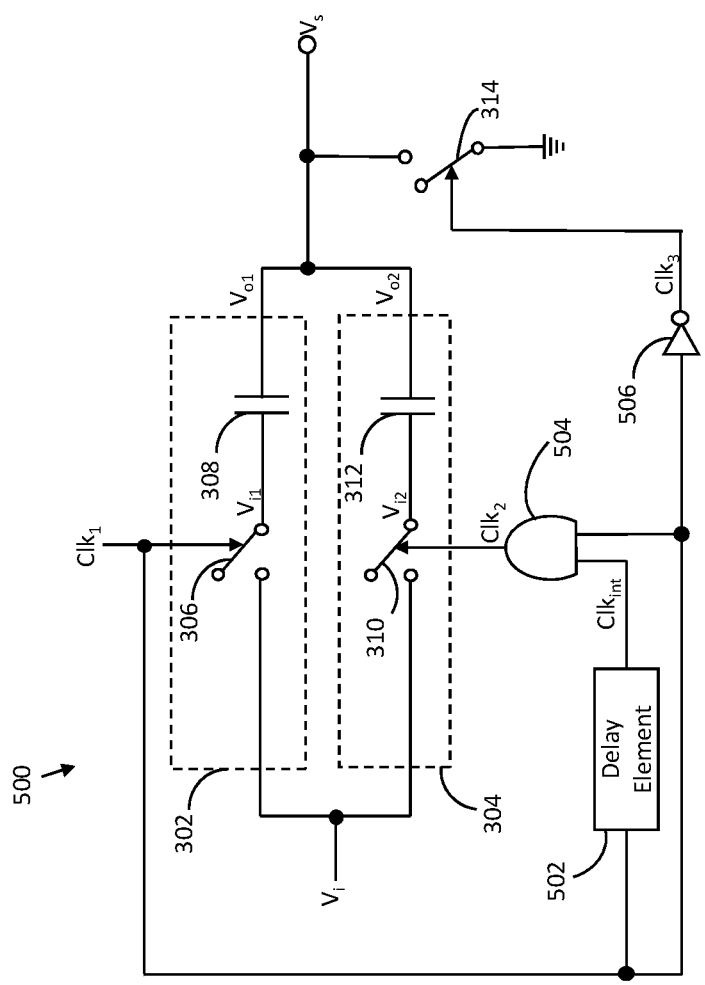
FIG. 5 is a schematic circuit diagram of a sample-and-hold circuit in accordance with a further embodiment of the present invention.

Referring now to FIG. 5, a schematic circuit diagram of a sample-and-hold circuit 500 in accordance with another embodiment of the present invention is shown. The sample-and-hold circuit 500 includes the first and second sample-and-hold modules 302 and 304 and the output switch 314, as well as a delay element 502 and first and second logic gates 504 and 506.

The delay element 502 is connected to the clock generating circuit 204 for receiving the first phase of the clock signal $Clk_1$. The delay element 502 delays the clock signal $Clk_1$ by a third delay value, and outputs an intermediate phase of the clock signal $Clk_{int}$.

The first logic gate 504 is connected to the clock generating circuit 204 and the delay element 502 for receiving the first and intermediate phases of the clock signal Clk1 and $Clk_{int}$, respectively. The first logic gate 504 outputs the second phase of the clock signal $Clk_2$, where the second phase is different from the first phase. In one embodiment, the first logic gate 504 is an AND gate.

The control terminal of the second switch 310 is connected to the first logic gate 504 for receiving the second phase of the clock signal $Clk_2$. When the second switch 310 is activated, the second capacitor 312 receives the input signal $V_i$ by way of the second switch 310.

The second logic gate 506 is connected to the clock generating circuit 204 for receiving the first phase of the clock signal $Clk_1$ and generating the third phase of the clock signal $Clk_3$ such that the third phase is different from the first phase. In one embodiment, the second logic gate 506 is an inverter or a NOT gate. The third switch 314 is thus activated and deactivated by way of the third phase of the clock signal $Clk_3$.

Figure 6B:
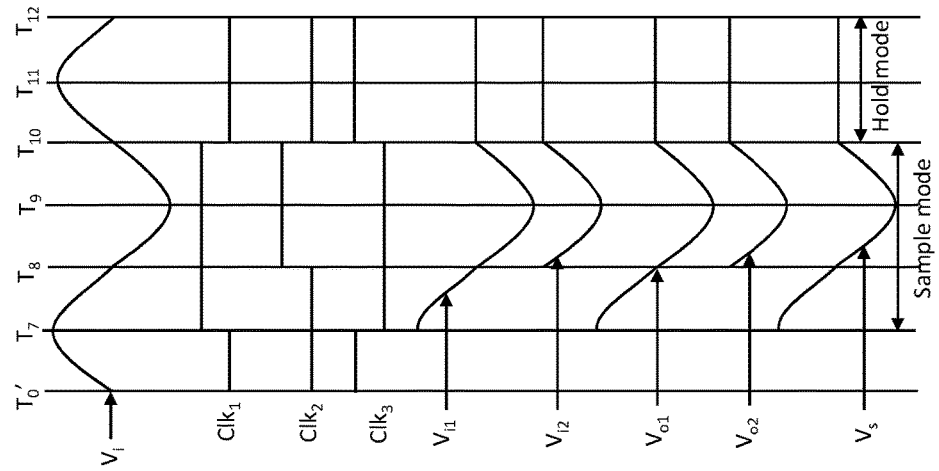
FIGS. 6A and 6B are timing diagrams illustrating operations of the sample-and-hold circuits of FIGS. 4 and 5, respectively.
Figure 6A:
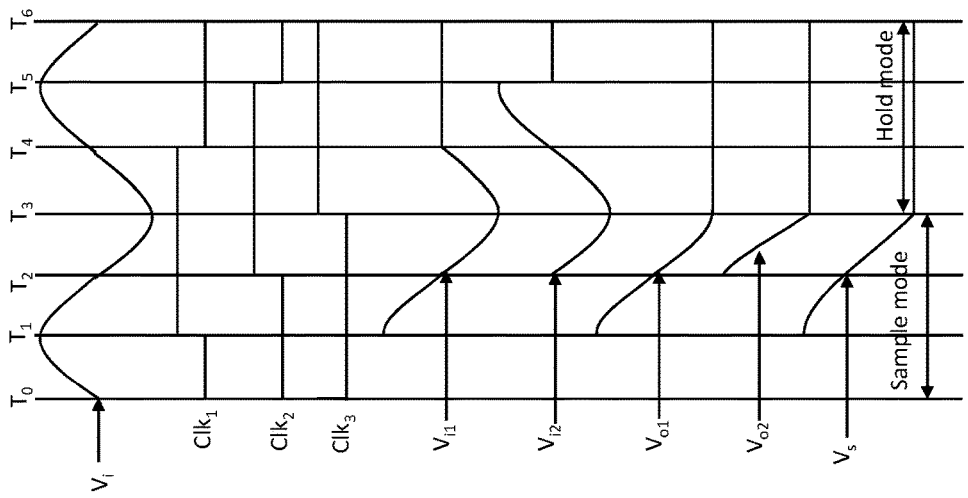

Referring now to FIG. 6A, a timing diagram 600 illustrating an operation of the sample-and-hold circuit 400 of FIG. 4 in accordance with an embodiment of the present invention is shown.

From time $T_0$-$T_1$, the first and second switches 306 and 310 are open and the output switch 314 is closed because the first-third phases of the clock signal $Clk_1$-$Clk_3$ are low. (As previously noted, in a preferred embodiment, the output switch 314 is low active), so the sampled output signal $V_s$ is pulled to ground.

At time $T_1$, the first phase of the clock signal goes from low to high, which activates the first switch 306. The first phase of the clock signal $Clk_1$ remains high from time $T_1$-$T_4$.

From time $T_1$-$T_2$, the first capacitor 308 receives the input signal $V_i$ (shown as $V_{i1}$). Since the third phase of the clock signal $Clk_3$ is low, the output switch 314 remains activated (stays closed). Thus, the sample-and-hold circuit 400 operates in the sample mode and the first sample-and-hold module 302 outputs the first output signal $V_{o1}$. As the second phase of the clock signal $Clk_2$ is low, the sampled output signal $V_s$ is based only on the first output signal Vo1.

At time $T_2$, the second phase of the clock signal $Clk_2$ goes from low to high, which activates the second switch 310. The clock signal $Clk_2$ remains high from time $T_2$-$T_5$.

From time $T_2$-$T_3$, the second capacitor 312 receives the input signal $V_i$ (shown by $V_{i2}$). Since the third phase of the clock signal $Clk_3$ is low, the first and second sample-and-hold modules 302 and 304 operate in the sample mode to output the first and second output signals $V_{o1}$ and $V_{o2}$, respectively. Thus, the sampled output signal $V_s$ is based on the first and second output signals $V_{o1}$ and $V_{o2}$.

At time $T_3$, the third phase of the clock signal $Clk_3$ goes from low to high, which deactivates the output switch 314. The clock signal $Clk_3$ remains high from time $T_3$-$T_6$.

From time $T_3$-$T_6$, the sample-and-hold circuit 400 operates in the hold mode and the first and second capacitors 308 and 312 hold corresponding voltage levels of the sampled input signal $V_i$ from the time $T_3$.

At time $T_4$, the first phase of the clock signal $Clk_1$ goes from high to low, which opens the first switch 306. Clock signal $Clk_1$ then remains low from time $T_4$-$T_6$. At time $T_5$, the second phase of the clock signal $Clk_2$ goes from high to low, which deactivates the second switch 310. The clock signal $Clk_2$ then remains low from time $T_4$-$T_6$. Thus, the first and second capacitors 308 and 312 continue to hold the voltage levels of the sampled input signal $V_i$ (sampled at time $T_3$).

From time $T_3$-$T_6$, the voltage level of the digital output signal $V_s$ is based on the voltage levels of the first and second output signals $V_{o1}$ and $V_{o2}$, respectively. In each of the sample and hold modes, the voltage level of the sampled output signal $V_s$ is an average of the voltage levels of the first and second output signals $V_{o1}$ and $V_{o2}$.

Referring now to FIG. 5B, a timing diagram 602 illustrating an operation of the sample-and-hold circuit 500 of FIG. 5 is shown.

From time $T_0'$-$T_7$, the switches 306, 310, and 314 are open because the clock signals at the first and second phases $Clk_1$ and $Clk_2$ are low and the clock signal at the third phase $Clk_3$ is high.

At time $T_7$, the first phase of the clock signal $Clk_1$ goes from low to high, which closes the first switch 306. The clock signal $Clk_1$ remains high from time $T_7$-$T_{10}$. Further, the third phase of the clock signal $Clk_3$ goes from high to low, which activates the output switch 314, and thus puts the sample-and-hold circuit 500 in sampling mode.

From time $T_7$-$T_8$, the first capacitor 308 receives the input signal $V_i$ (shown by $V_{i1}$), and the clock signal $Clk_3$ is low, so the sample-and-hold circuit 206 operates in the sampling mode and the sampled output signal $V_s$ is based on the first output signal $V_{o1}$.

At time $T_8$, the clock signal $Clk_2$ goes from low to high, which activates the second switch 310 so the second capacitor 312 receives the input signal $V_{i2}$. The clock signal $Clk_3$ remains high from time $T_8$-$T_{10}$. From time $T_8$-$T_{10}$, the second capacitor 312 receives the input signal $V_i$ (shown by $V_{i2}$). As the clock signal $Clk_3$ is low, the first and second sample-and-hold modules 302 and 304 both operate in the sampling mode, and the sampled output signal $V_s$ is based on both the first and second output signals $V_{o1}$ and $V_{o2}$.

At time $T_{10}$, the clock signals $Clk_1$ and $Clk_2$ both go from high to low thereby deactivating the first and second switches 306 and 310, and both $Clk_1$ and $Clk_2$ remain low from time $T_{10}$-$T_{12}$. Further, at time $T_{10}$ the clock signal $Clk_3$ goes from low to high, which deactivates the output switch 314. The clock signal $Clk_3$ then remains high from time $T_{10}$-$T_{12}$.

From time $T_{10}$-$T_{12}$, the sample-and-hold circuit 500 operates in the hold mode and outputs the sampled output signal $V_s$ (i.e., a digital output signal) based on the first and second output signals $V_{o1}$ and $V_{o2}$. The voltage levels of the first and second output signals $V_{o1}$ and $V_{o2}$ are the voltage levels held across the first and second capacitors 308 and 312 at time $T_{10}$, respectively.

It now should be apparent that a sample-and-hold circuit is formed with a plurality of parallel connected sample-and-hold modules that are activated using a staggered clock signal has been disclosed. The sample-and-hold circuit of the present invention provides numerous advantages over conventional sample-and-hold circuits. The staggered clock signal is generated in such a way that it flattens the peak current of the analog input signal such that the input signal appears as a low-value static current (in a short span), which relaxes bandwidth and power requirements drastically. The sample-and-hold circuit is easily combined with other circuitry that already has segmented capacitors like SAR, MDAC, CAP-DAC, etc.

A sample-and-hold circuit in accordance with the present invention was implemented in a 12-bit 80-MS/s ADC, and it was determined that power consumption was reduced by about four times compared to a conventional design. The first stage of the ADC was a 2.5-bit MDAC, while the second stage was a 10-bit SAR. Sample-and-hold from SAR was degrading performance of the MDAC because the peaks current was close to 60 mA, while the MDAC consumed only 6.5 mA current. MDAC functions as a drive circuit for SAR sample-and-hold.

It will be understood by those of skill in the art that the same functions may be performed by different modules of components that may operate using either high active or low active signals. Therefore, variations in the arrangement of some of the components described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A sample-and-hold circuit that receives an input signal and generates a sampled output signal, the sample-and-hold circuit comprising:

a first sample-and-hold module that receives the input signal and a first phase of a clock signal, wherein the first sample-and-hold module comprises a first capacitor having first and second terminals, wherein the first sample-and-hold module provides a first module output at the second terminal of the first capacitor, and a first switch connected between an input of the first module that receives the input signal and the first terminal of the first capacitor, wherein the first switch is controlled by the first phase of the clock signal, and wherein the first capacitor receives the input signal when the first switch is activated;

a second sample-and-hold module, connected in parallel to the first sample-and-hold module, that receives the input signal and a second phase of the clock signal that is different from the first phase, wherein the second sample-and-hold module comprises a second capacitor having first and second terminals, wherein the second sample-and-hold module provides a second module output at the second terminal of the second capacitor, and a second switch connected between an input of the second module that receives the input signal and the first terminal of the second capacitor, wherein the second switch is controlled by the second phase of the clock signal, wherein the second capacitor receives the input signal when the second switch is activated, and wherein the sampled output signal is based on the first and second output signals;

a first delay element that receives the first phase of the clock signal and generates the second phase of the clock signal; and an output switch, connected to outputs of the first and second sample-and-hold modules, wherein the output switch is activated and de-activated by a third phase of the clock signal that is different from the first and second phases, and wherein the first and second sample-and-hold modules operate in a sample mode when the output switch is activated and in a hold mode when the output switch is de-activated.

2. The sample-and-hold circuit of claim 1, wherein a driving circuit is connected to the first and second sample-and-hold modules for providing the input signal, and wherein the driving circuit is at least one of a programmable gain amplifier, a buffer, and a filter.

3. The sample-and-hold circuit of claim 1, wherein a clock generating circuit is connected to the first sample-and-hold module for providing the first phase of the clock signal.

4. The sample-and-hold circuit of claim 1, further comprising a second delay element that receives the first phase of the clock signal and generates the third phase of the clock signal.

5. The sample-and-hold circuit of claim 1, further comprising a second delay element that receives the second phase of the clock signal from the first delay element and generates the third phase of the clock signal.

6. The sample-and-hold circuit of claim 1,
wherein the first delay element receives the first phase of the clock signal and generates an intermediate phase of the clock signal; and
a first logic gate that receives the first and intermediate phases of the clock signal and outputs the second phase of the clock signal.

7. The sample-and-hold circuit of claim 6, further comprising a second logic gate that receives the first phase of the clock signal and outputs the third phase of the clock signal.

8. A sample-and-hold circuit that operates in sample and hold modes and outputs a sampled output signal, the sample-and-hold circuit comprising:
a first sample-and-hold module, comprising:
a first switch that receives an input signal and is controlled by a first phase of a clock signal; and
a first capacitor connected to the first switch for receiving the input signal when the first switch is activated and providing a first output signal in the sample and hold modes;
a second sample-and-hold module connected in parallel to the first sample-and-hold module, the second sample-and-hold module comprising:
a second switch that receives the input signal and is controlled by a second phase of the clock signal that is different from the first phase; and
a second capacitor connected to the second switch for receiving the input signal when the second switch is activated and providing a second output signal in the sample and hold modes;
an output switch connected to the first and second capacitors for receiving the first and second output signals, wherein the output switch is controlled by a third phase of the clock signal that is different from the first and second phases, wherein the sample-and-hold circuit operates in the sample mode when the third switch is activated and in the hold mode when the third switch is de-activated, and wherein the sampled output signal is based on the first and second output signals; and
a first delay element that receives the first phase of the clock signal and generates the second phase of the clock signal; and
a second delay element that receives one of the first and second phases of the clock signal and generates the third phase of the clock signal therefrom.

9. The sample-and-hold circuit of claim 8, wherein a driving circuit is connected to the first and second switches for providing the input signal, and wherein the driving circuit is at least one of a programmable gain amplifier, a buffer, and a filter.

10. The sample-and-hold circuit of claim 8, wherein a clock generating circuit is connected to the first switch for providing the first phase of the clock signal thereto.

11. The sample-and-hold circuit of claim 8, wherein the first delay element comprises:
a delay element that receives the first phase of the clock signal and generates an intermediate phase of the clock signal; and
a first logic gate that receives the first phase of the clock signal and the intermediate phase of the clock signal and generates the second phase of the clock signal.

12. The sample-and-hold circuit of claim 11, wherein the second delay element comprises a second logic gate that receives the first phase of the clock signal and generates the third phase of the clock signal therefrom.

13. A sample-and-hold circuit that receives an analog input signal and generates a digital output signal, the sample-and-hold circuit comprising:
a plurality of switches each having a first terminal for receiving the analog input signal;
a plurality of capacitors corresponding to the plurality of switches, wherein each capacitor has a first terminal connected to a second terminal of a corresponding one of the switches of the plurality of switches and a second terminal connected to the second terminals of the other capacitors of the plurality of capacitors, wherein the digital output signal is provided at a node connecting the second terminals of the capacitors, wherein each switch of the plurality of switches and the output switch are controlled by a different phase of a clock signal;
a first delay element that receives a first phase of the clock signal and generates a second phase of the clock signal, wherein the first phase of the clock signal controls a first switch of the plurality of switches and the second phase of the clock signal controls a second switch of the plurality of switches; and
an output switch having a first terminal connected to the node for controlling the digital output signal.

14. The sample-and-hold circuit of claim 13, wherein sizes of the capacitors are the same.

15. The sample-and-hold circuit of claim 13, wherein sizes of at least two of the capacitors are different.

* * * * *